(12) United States Patent
Schepp et al.

(10) Patent No.: US 7,398,509 B2
(45) Date of Patent: Jul. 8, 2008

(54) NETWORK-BASED PHOTOMASK DATA ENTRY INTERFACE AND INSTRUCTION GENERATOR FOR MANUFACTURING PHOTOMASKS

(75) Inventors: Jeffry S. Schepp, Round Rock, TX (US); Jan E. Gentry, Round Rock, TX (US); Thomas T. Cogdell, Austin, TX (US)

(73) Assignee: Toppan Photomasks, Inc., Round Rock, TX (US)

( * ) Notice: Subject to any disclaimer, the term of this patent is extended or adjusted under 35 U.S.C. 154(b) by 238 days.

(21) Appl. No.: 11/283,569

(22) Filed: Nov. 18, 2005

(65) Prior Publication Data

US 2006/0074510 A1   Apr. 6, 2006

Related U.S. Application Data

(63) Continuation of application No. 10/657,648, filed on Sep. 8, 2003, now Pat. No. 6,968,530, which is a continuation of application No. 09/610,917, filed on Jul. 5, 2000, now Pat. No. 6,622,295.

(51) Int. Cl.
    *G06F 17/50* (2006.01)
(52) U.S. Cl. .............................. 716/19; 716/20; 716/21
(58) Field of Classification Search ................... 716/19, 716/20, 21; 700/121
    See application file for complete search history.

(56) References Cited

U.S. PATENT DOCUMENTS 5,416,772 A   5/1995   Edwards et al. ............... 716/11
5,539,975 A   7/1996   Kukuljan et al. ............... 29/701
5,625,801 A   4/1997   Fukuya ........................ 395/500
5,694,551 A   12/1997  Doyle et al. ................... 705/26
5,732,218 A   3/1998   Bland et al. ............ 395/200.54
5,825,651 A   10/1998  Gupta et al. ............ 364/468.09
5,844,810 A   12/1998  Douglas et al. ............... 700/56
5,870,719 A   2/1999   Maritzen et al. ............... 705/26
5,920,846 A   7/1999   Storch et al. ................... 705/7
5,933,350 A   8/1999   Fujimoto et al. ........ 364/468.28
5,950,201 A   9/1999   Van Huben et al. ........... 707/10

(Continued)

FOREIGN PATENT DOCUMENTS

EP    1 003 087 A1    5/2000

OTHER PUBLICATIONS

Peltier et al. "MIDAS: The Multichip Module Designers' Access Service" ISHM '95 Proceedings (pp. 543-547), Oct. 25, 1995.

(Continued)

*Primary Examiner*—Sun James Lin
(74) *Attorney, Agent, or Firm*—Baker Botts L.L.P.

(57) ABSTRACT

A computer network for generating instructions for photomask manufacturing equipment, based on photomask specification data input by a customer. A series of order entry screens are downloaded to a remote customer's computer, typically via an internet connection. The customer is prompted to enter photomask specification data, which is delivered to computing equipment on the manufacturer's local network. The manufacturer's computing equipment validates the photomask specification data, and uses this data to generate fracturing instructions and equipment control instructions. The fracturing instructions, together with pattern design data from the customer, are delivered to a fracture engine, which provides fractured pattern data. The control instructions and the fractured pattern data may then be electronically delivered to the manufacturing equipment.

24 Claims, 12 Drawing Sheets

U.S. PATENT DOCUMENTS

| | | | |
|---|---|---|---|
| 5,963,953 A | 10/1999 | Cram et al. | 707/102 |
| 5,969,973 A | 10/1999 | Bourne et al. | 364/474.07 |
| 6,003,012 A | 12/1999 | Nick | 705/10 |
| 6,009,406 A | 12/1999 | Nick | 705/10 |
| 6,023,565 A | 2/2000 | Lawman et al. | 716/1 |
| 6,023,699 A | 2/2000 | Knoblock et al. | 707/10 |
| 6,076,080 A * | 6/2000 | Morscheck et al. | 705/400 |
| 6,154,738 A * | 11/2000 | Call | 707/4 |
| 6,330,708 B1 | 12/2001 | Parker et al. | 716/19 |
| 6,760,640 B2 * | 7/2004 | Suttile et al. | 700/121 |
| 2004/0025137 A1 * | 2/2004 | Croke et al. | 716/19 |

OTHER PUBLICATIONS

Office Action for European Patent Application No. EP01952380.2 (8 pages), Nov. 28, 2006.

PCT Written Opinion PCT/US01/21020, Mailed Jan. 3, 2003.

Peltier, J. et al. "Low cost, prototype ASIC and MCM fabrication and assembly from the MOSIS service" Proceedings. 1997 IEEE, pp. 68-69, XP002199595, 1997.

Luo et al. "Desktop Rapid Prototyping System With Supervisory Control and Monitoring Through Internet" IEEE/ASME Transactions on Mechatronics vol. 6, No. 4; pp. 399-409. XP002199596, Dec. 2001.

PCT /US 01/21020 Search Report, Mailed Jun. 6, 2002.

Suttile et al., "Streamlining the frontend reticle fabrication process by improving mask ordering", MicroMagazine.com, Jun. 2002.

Photoplot Store at http://web.archive.org/web/20000614112553/ http://www.photoplotstore.com/, Jun. 2000.

\* cited by examiner

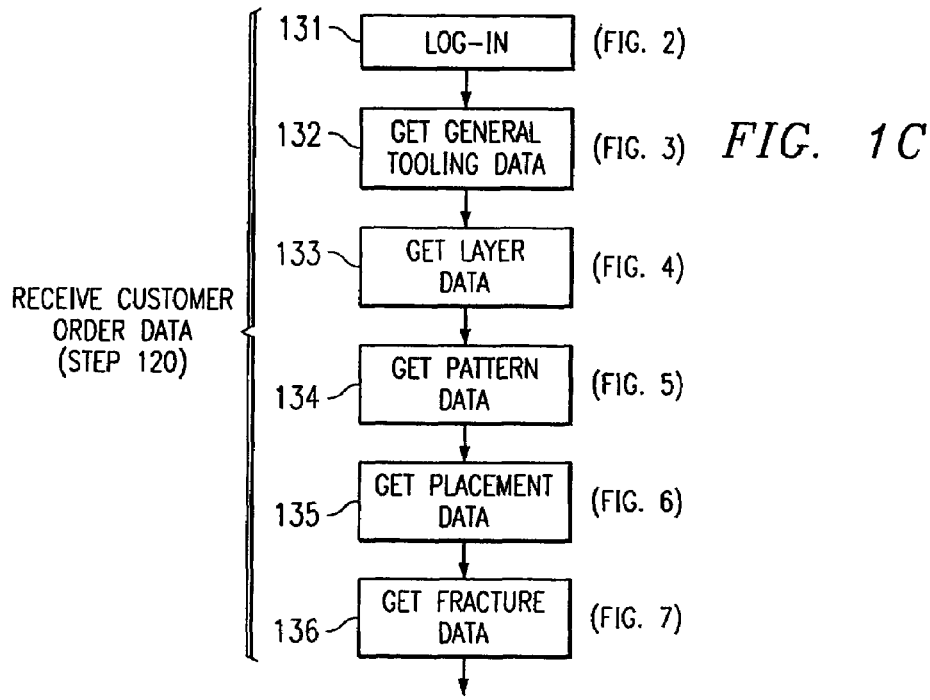

30a { [Main Menu] [Get a Quote/Account] [Account] [Mask Order] [Info] [Feedback] [Help] [Logout]

[Instructions] [General] [Layers] [Patterns] [Placements] [Fractures] [Business] [Submit]

Please create your new order by completing as thoroughly as possible the following fields, then pressing the "Save and Forward" button to progress to *Layer Information*, the next step of the Mask Order Wizard.

*To get help for any field, hold your mouse cursor over that field's help icon ( ? ).*

30 —

| Other Methods For Working With Orders | |
|---|---|
| Reload an In-progress Order: | [ ▼ ] [Reload] |
| Create New Order Based On Old: | [ ▼ ] [Copy to create new order] |

— 31

[← Create And Back]  [Create And Stay]

[Create And Forward →]

33

Customer Information      Quality Control

32 {
Customer: [____] (?)
Fab: [____] ?
Contact Name: [____] (?)
Phone: [____] (?)
Fax: [____] (?)
E-mail: [____] (?)

Defect Criteria: [____ ▼] (?)

34

Documentation

Plot Size: [____ ▼] (?)

FIG. 3B
FROM FIG. 3A

Required Order Information

This information is required immediately in order to accurately generate the layer & pattern information screens.

35 {
- Device:
- Number of Layers
- Number of Unique Device Patterns

Pellicles

36 {
- Chrome-side? No
- Glass-side? No
- Stepper Manufacturer
  - Other:
- Stepper Model:
- Chrome-side Part Number:
- Glass-side Part Number:

Tooling and Materials

37 {
- Product Type:
  - Other:
- Glass Type:
- Glass Size & Thickness:
- Coating:
- Reflectivity: %

Compacts

- Compact Part Number:

[←Create And Back]  [Create And Stay]

[Create And Forward →] ~38

30

❓ =Optional for order   ⓘ =Required for submit, optional for this screen   ❗ =Required for this screen

| Main Menu | Get a Quote/Account | Account | Mask Order | Info | Feedback |
| | | | | Help | Logout |

| Instructions | General | Layers | Patterns | Placements | Fractures | Business | Submit |

| TestCompany | View summary | In Progress |

Please complete the information for each distinct pattern, and press the "Save and Forward" button to progress to *Pattern Placement*.

*If the number of patterns or layer information is wrong, please return to the General Info Screen and correct the number of distinct patterns, then return to this screen.*

[←Save And Back]   [Save And Stay]

[Save And Forward→]

Patterns 1 – 1 of 1
Layers 1 – 1 of 1

Pattern #1 — Pattern Name: [▼] ⓥ  Fracture Required? [▼] ⓥ

| Layer | Number of Placements | Address Units Out (μ) | Final CD Size(μ) | CD Tolerance (μ) | CD Digitized? | Digitized Data Tone |
| --- | --- | --- | --- | --- | --- | --- |
| 1 Pattern application | [ ] ⓥ | [ ] ⓥ | [ ] ⓥ | +/−[ ] ⓟ | [▼] ⓥ | [▼] ⓥ |

[←Save And Back]   [Save And Stay]

[Save And Forward→]

ⓟ = Optional for order   ⓥ = Required for submit, optional for this screen   ⓥ = Required for this screen

| Main Menu | Get a Quote/Account | Account | Mask Order | Info | Feedback |
| | | | | Help | Logout |

[Instructions] [General] [Layers] [Patterns] [Placements] [Fractures] [Business] [Submit]

| TestCompany | View summary | In Progress |

Please complete the fracture information for every fracture pattern, and press the "Save and Forward" button to progress to *Chip Placement*.

For patterns that are not fractures, you will have to provide a pattern file in either MEBES or CFLT format.

*If the number of patterns that are fractures on this screen is wrong, please return to the Pattern Specification Screen and change the Fracture Required values, then return to this screen.*

[←Save And Back]  [Save And Stay]

Patterns 1 - 1 of 1    [Save And Forward →]    71

| Pattern | Fracture? | Database Name | Top Structure | Data Scale Out |

1
*Prime-1*  Yes  [ ]ⓘ  [ ]ⓘ  [ ]ⓘ    }72

GDS ⓘ
Layers
Layer    GDS Layers
1
*Patent
Application*

Window Limits ⓘ
(μ)
Lower Left
X [ ]  Y [ ]
Upper Right
X [ ]  Y [ ]

}73

[←Save And Back]  [Save And Stay]
[Save And Forward →]

? =Optional for order   ⓘ =Required for submit,   ⓘ =Required for this
                            optional for this screen       screen

| Main Menu | Get a Quote/Account | Account | Mask Order | Info | Feedback |
| Help | Logout |

| Instructions | General | Layers | Patterns | Placements | Fractures | Business | Submit |

TestCompany — View summary — In Progress

Please complete the business information for your order, and press the "Save and Forward" button to progress to *Submit Order*.

[←Save And Back] [Save And Stay] [Save And Forward→]

Billing Information

- PO Number:
- Street Address:
- City:
- State:
- Country:
- Postal Code:
- Contact Name:
- Phone:
- Fax:
- Email:

Shipping Information (same as billing)

- Street Address:
- City:
- State:
- Country:
- Postal Code:
- Contact Name:
- Phone:
- Fax:
- E-mail:

Other Order Information

- Expected Delivery:
- Comments/Instructions:

[←Save And Back] [Save And Stay] [Save And Forward→]

❓ =Optional for order    ⓘ =Required for submit, optional for this screen    ⓘ =Required for this screen

FIG. 9

| Main Menu | Get a Quote/Account | Account | Mask Order | Info | Feedback |
| | | | | Help | Logout |

| Instructions | General | Layers | Patterns | Placements | Fractures | Business | Submit |

TestCompany RR     View summary     Validated

Congratulations!
Your order has been validated to contain all necessary information.

Submit the order
Click the button at the bottom of the screen to transmit the order information. You may then FTP the data files for the order.

*You must click the button to submit the order. Once you click the button, you will not be able to change any of the order information using the Order Form. Instead, you will have to talk to a customer service representative to change any order information.*

→     FINALIZE ORDER AND SUBMIT

FIG. 10A

General Order Information
Sales
order:
Site:
Customer:
Contact:

Fab:
Device:
Product
Type:
Glass
Type:
Glass Size:
Coating:
Defect
Criteria:
Plot Size:
Pellicle
Chrome?
Pellicle
Glass?
Stepper:
Compact
Part:
Delivery:
Comments:

Business Information
Billing information:

Shipping information:

Manufacturer-specific Information:

Layers

| # | Mask Name | Barcode Text | Registration Tolerance | Defect Size | Defect Density | Mask Parity | | Title Parity | |
|---|---|---|---|---|---|---|---|---|---|
| 1 | SYSTEM TEST 1 | KDKDKDK | 0.150 um | 1.0 um | 0 def/sq.in | Wrong Reading | Right Reading | Wrong Reading | Right Reading |
| 2 | SYSTEM TEST 2 | HSHSHSH | 0.250 um | 0.75 um | 1 def/sq.in | | | | |

FROM FIG. 10A

Distinct Patterns

| # | Pattern Name | Address Units Out | Final CD Size | Final CD Tolerance | CD Digitized | Digitized Data Tone | Fracture Database Name | Top Structure | GDS Layers | Data Scale Out | Window Limits |
|---|---|---|---|---|---|---|---|---|---|---|---|
| 1 | Prime-1-1 | 0 | 1 | 0 | Yes | Dark | JEFF.GDS | MAIN | 1,3,5,7 | 1 | (−12000, −15000) (12000, 15000) |
| 2 | Scribe-2-2 | 0 | 1 | 0 | No | Clear | JEFF.GDS | TOP | 2,4,6,8 | 1 | (−10000, −9000) (10000, 9000) |

Placement of Patterns on Layers

| Layer # | Mask Title | Pattern | X | Y |
|---|---|---|---|---|
| 1 | SYSTEM TEST 1 | | | |
| | | Scribe-2-2 | 14000 | 9000 |
| 2 | SYSTEM TEST 2 | | 16000 | 10000 |
| | | Scribe-2-2 | 13256 | 14859 |

NETWORK-BASED PHOTOMASK DATA ENTRY INTERFACE AND INSTRUCTION GENERATOR FOR MANUFACTURING PHOTOMASKS

RELATED APPLICATIONS

This application is a Continuation Application which claims the benefit of U.S. patent application Ser. No. 10/657,648 entitled NETWORK-BASED PHOTOMASK DATA ENTRY INTERFACE AND INSTRUCTION GENERATOR FOR MANUFACTURING PHOTOMASKS, filed on Sep. 8, 2003, by Jeffry S. Schepp et al. now U.S. Pat. No. 6,968,530 granted Nov. 22, 2005, which is a Continuation Application which claims the benefit of U.S. patent application Ser. No. 09/610,917 entitled NETWORK-BASED PHOTOMASK DATA ENTRY INTERFACE AND INSTRUCTION GENERATOR FOR MANUFACTURING PHOTOMASKS, filed on Jul. 5, 2000, by Jeffry S. Schepp et al., now U.S. Pat. No. 6,622,295 granted Sep. 16, 2003.

TECHNICAL FIELD OF THE INVENTION

This invention relates to the manufacture of photomasks, and more particularly to a network-based system that permits a remote customer to provide pattern design data and photomask specifications, and that uses this data to generate instructions for photomask manufacturing equipment.

BACKGROUND OF THE INVENTION

Photomasks are an integral part of the lithographic process of semiconductor manufacturing. Photomasks are quartz or glass plates that contain precision images of layers of integrated circuits. They are used to optically transfer the images to semiconductor wafers during photoresist exposure.

Photomasks require complex mathematical algorithms for their design and use sophisticated manufacturing techniques. To make a photomask, a customer, such as a chipmaker, provides the photomask manufacturer with circuit design data and photomask specifications. This data is used to generate photomask pattern data in a format appropriate for the manufacturing equipment. Each photomask is then created by using photolithographic techniques.

Conventionally, the data provided by the customer is in whatever format is convenient for the customer, based on the customer's design system. The circuit design data is typically from a CAD type system, with a design for each pattern. The data might be delivered to the manufacturer on various media, such as a floppy disk, magnetic tape, cassette, or via a modem connection. The photomask specifications might be in hardcopy form or in electronic form, on some sort of physical media delivered to the manufacturer, or delivered electronically. There is no guarantee that this customer-provided data will be complete or that it will result in a manufacturable photomask.

SUMMARY OF THE INVENTION

One aspect of the invention is a network-based method of generating instructions for use by photomask manufacturing equipment. A customer computer establishes a remote connection to wide area network, also accessible by a local network of the manufacturer. A series of order entry display screens is downloaded to the customer computer. These screens prompt the customer to enter photomask specification data, which identifies layers, patterns, placements, and fracturing data for at least one photomask. This photomask specification data is communicated to a local network of the photomask manufacturer. The local network validates the photomask specification data during the remote connection. The local network also generates two types of instructions in response to the photomask specification data: fracturing instructions and equipment control instructions. The fracturing instructions operate on pattern design data from the customer so as to provide fractured pattern data. Both the fractured pattern data and the control instructions may be electronically delivered to the manufacturing equipment.

An advantage of the invention is that the local network operates directly in response to customer-provided photomask specification data. It does not require data input by the photomask manufacturer. The method occurs "on-line", in the sense that photomask specification data is received and processed using electronic transfers of the data. It is received in a desired format, so that no reformatting is required for the input to the command generator.

This method of entering photomask specification data greatly reduces the time required to manufacture a photomask. For example, when patterns are manually fractured in the conventional manner, the fracturing process can take up to 70 times longer than with the present invention. With the present invention, fracturing instructions may be generated as the customer is entering order data.

At the same time, the invention ensures that the customer provides all necessary information, for both manufacturing and accounting. Information is received in a uniform format. The order data is verified to ensure that the photomask is manufacturable. The order entry process may be easily integrated with a billing system for accounting purposes.

BRIEF DESCRIPTION OF THE DRAWINGS

FIG. 1C illustrates the order entry steps of FIG. 1B.

FIGS. 2-7 illustrate various display screens downloaded to the customer's computer, consistent with the order entry steps of FIG. 1C.

FIG. 8 illustrates a display screen for entering billing information during the billing data step of FIG. 1B.

FIG. 9 illustrates a validation screen for displaying the results of the validation step of FIG. 1B.

FIGS. 10A and 10B illustrate an order summary display, which is delivered to the manufacturing plant.

DETAILED DESCRIPTION OF THE INVENTION

System Overview

Figure 1A:
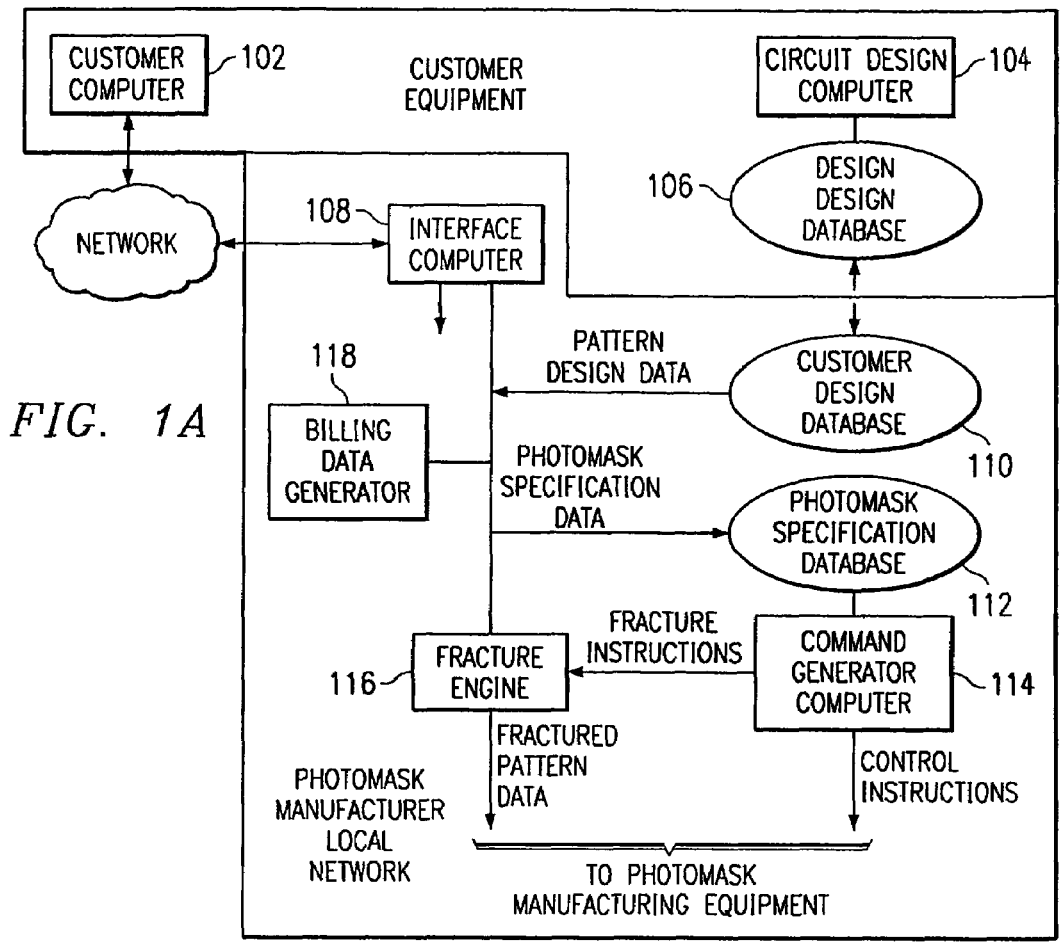
FIG. 1A illustrates a network-based system for obtaining photomask data and generating manufacturing instructions in accordance with the invention.
Figure 1B:
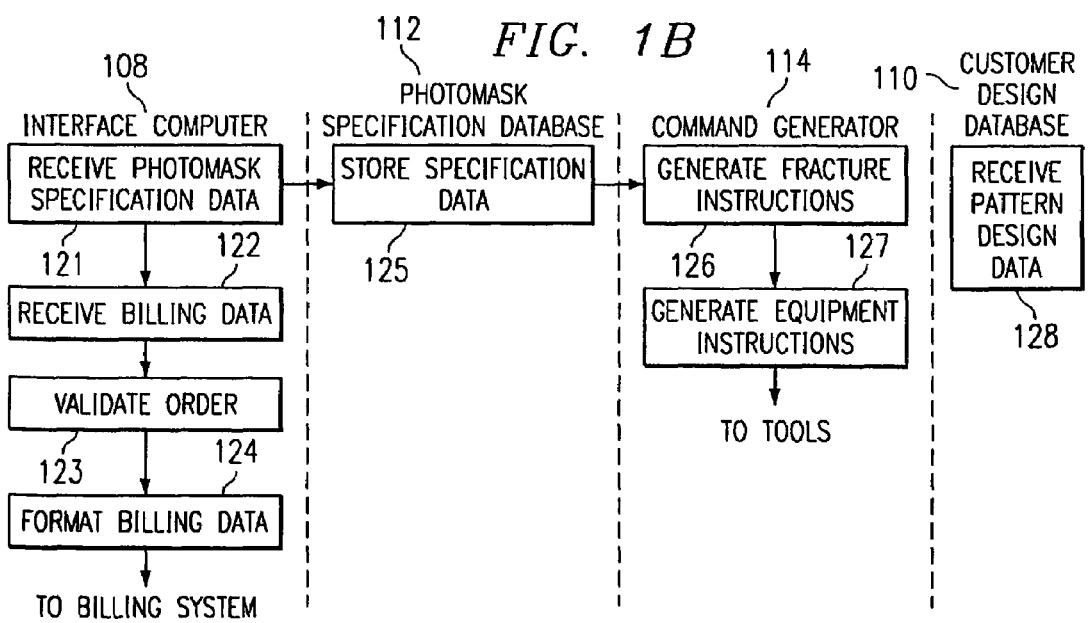
FIG. 1B illustrates the method followed by the system of FIG. 1A.

FIG. 1A illustrates a network-based system for obtaining photomask data and generating manufacturing instructions in accordance with the invention. FIG. 1B illustrates the method performed by the system of FIG. 1A.

Computers 102, 108, 114, and 118 are assumed to have the processing resources and memory to implement the functions described herein. They are further assumed to have associated program memory for storing programming for those functions.

As indicated in FIG. 1A, the customer is assumed to have a customer computer 102, as well as a circuit design computer 104 and circuit design database 106. The customer's computing equipment could be on a local network of the customer.

The rest of the computing equipment shown in FIG. 1A are elements of a local network 100 operated by the photomask manufacturer. In the example of FIG. 1A, all of this equipment is on the same local area network (LAN), but other processing architectures are possible.

With regard to distribution of processing tasks on the computer equipment, FIGS. 1A and 1B are but one possible embodiment. For example, various processing tasks performed by computers 108, 114, and 118 on the manufacturer's local network 100 could be performed on fewer computers. As another example, although FIG. 1B illustrates Steps 120-124 as being all performed by a single interface computer 108, these steps could be performed on different computer equipment. Although the following description refers to certain processing tasks as being performed by specific computers in local network 100, in a more general sense, these tasks can be thought of as being performed by local network 100.

Customer computer 102 provides access, via a remote connection, to an interface computer 108. The network access may be via any LAN or WAN. Typically, the remote connection is via a wide area network (WAN). For example, the network could be the Internet, and customer computer 102 could establish a connection to a web site. Various user interface screens described herein are downloaded to customer computer 102. Interface computer 108 would receive the photomask data that the customer enters on these screens. The various network servers and other equipment will vary depending on the type of network; only the end stations are illustrated in FIG. 1A. In the case of an Internet connection, customer computer 102 need not have special programming other than a web browser.

The customer also has a circuit design computer 104. Circuit design computer 104 stores programming for generating designs the customer's integrated circuit. It is possible that computers 102 and 104 could be the same equipment, although typically, computer 102 is a PC type computer and computer 104 is a UNIX type workstation. The customer's circuit design data is stored in the customer's design library database 106. As illustrated by Step 127 of FIG. 1B, at some point prior to manufacture of the photomask(s), this design data is transferred to customer design database 110 for access by the manufacturer's local network.

Interface computer 108 stores programming for receiving photomask specification data from the customer via the network connection. In other words, photomask specification data is received on-line from the customer, using order entry forms that organize the data in a particular format. This data is immediately available to other computing equipment on the manufacturer's local network. Interface computer 108 also stores programming that uses the photomask specification data to design one or more photomasks that will meet all manufacturing requirements as well as the customer's specifications. Steps 120-124 of FIG. 1B illustrate an order entry process and other processes performed by interface computer 108.

Computer 108 stores the photomask specification data in photomask specification database 112. This data is accessed by command generator 114, which generates instructions that are delivered to the photomask fabrication equipment. Specifically, command generator 114 generates fracturing instructions which are delivered to fracture engine 116. Fracture engine 116 also receives pattern design data from database 110 and generates fractured pattern data. The command generator 114 also generates control instructions, which specify where and how patterns are to be written.

The fractured pattern data and the control instructions are delivered to memory accessible by the manufacturing equipment, which produces a photomask for each layer of the integrated circuit. In today's manufacturing environment, the manufacturing equipment is computer-controlled lithography equipment.

Billing file generator 118 is used to interface the photomask specification data to the manufacturer's billing system. It selects appropriate data and arranges it in a format useable by the billing system.

On-line Entry of Photomask Specifications

FIG. 1C illustrates a number of steps performed during Step 121 of FIG. 1B. During this step, interface computer 108 receives photomask specification data, using a forms type order entry interface. As explained below, it is assumed that the customer has accessed a network for downloading various user interface screens. These screens are displayed on customer computer 102, and guide the customer to enter photomask specification data.

Each of the Steps 131-136 of FIG. 1C is associated with a different user interface screen. These screens are illustrated in FIGS. 2-7. To submit a photomask order, the customer accesses these screens in succession and enters data as prompted by each screen.

The display screens are arranged in a manner that delivers data to interface computer 108 in a form that permits computer 108 to generate appropriate instructions for that order. The screens have various interface features known to persons who use windows-type operating systems. These features include data entry boxes, pull down menus, and selection buttons and bars. Help icons permit the customer to view help information.

FIG. 2 illustrates a log-in screen 20, which is the first screen that the customer views. Where access is via the Internet, this screen is displayed in response to the customer entering the URL of the photomask manufacturer.

Each order requires that the customer first have an account. A new-customer link 21 permits the customer to set up an account and thereby receive a username and password. At this time, the customer may also be set up for network access to customer design database 110. This permits the customer to electronically transfer circuit design data from the customer's database 106 to a database 110 maintained by the manufacturer. As explained below, this transfer need not be accomplished by the same network connection as is used to create an order.

To enter an order, the user is prompted to enter a username and password. A menu 22 permits the user to request that a new order be created.

FIGS. 3A and 3B illustrate a general tooling data screen 30. A navigation bar 30a at the top of screen 30 informs the customer of the current location within the design process and permits the customer to navigate among all screens.

An order copy box 31 permits the customer to reload an order in progress or to create a new order based on an old order. This reduces the need for the customer to re-enter data that is to be re-used for the new order.

A customer information box 32 prompts the customer to enter relevant contact information. A quality control box 33 provides a pull down menu for types of quality control, such as die to die, manual, or die to database. A documentation box 34 provides a pull down menu for selecting documentation.

A layer and pattern box 35 prompts the user to name the device, and to specify the number of layers and patterns. A tooling and materials box 37 provides pull down menus for product type, glass type, glass size and thickness, and coating. A reflectivity specification may also be entered. A pellicle box 36 permits the customer to specifies pellicle data. Various stepper data may also be entered.

A "create and forward" button 38 prompts the customer to save the information entered on screen 30 and proceed to the next screen. The information entered on screen 30 is carried forward to subsequent screens.

Figure 4:
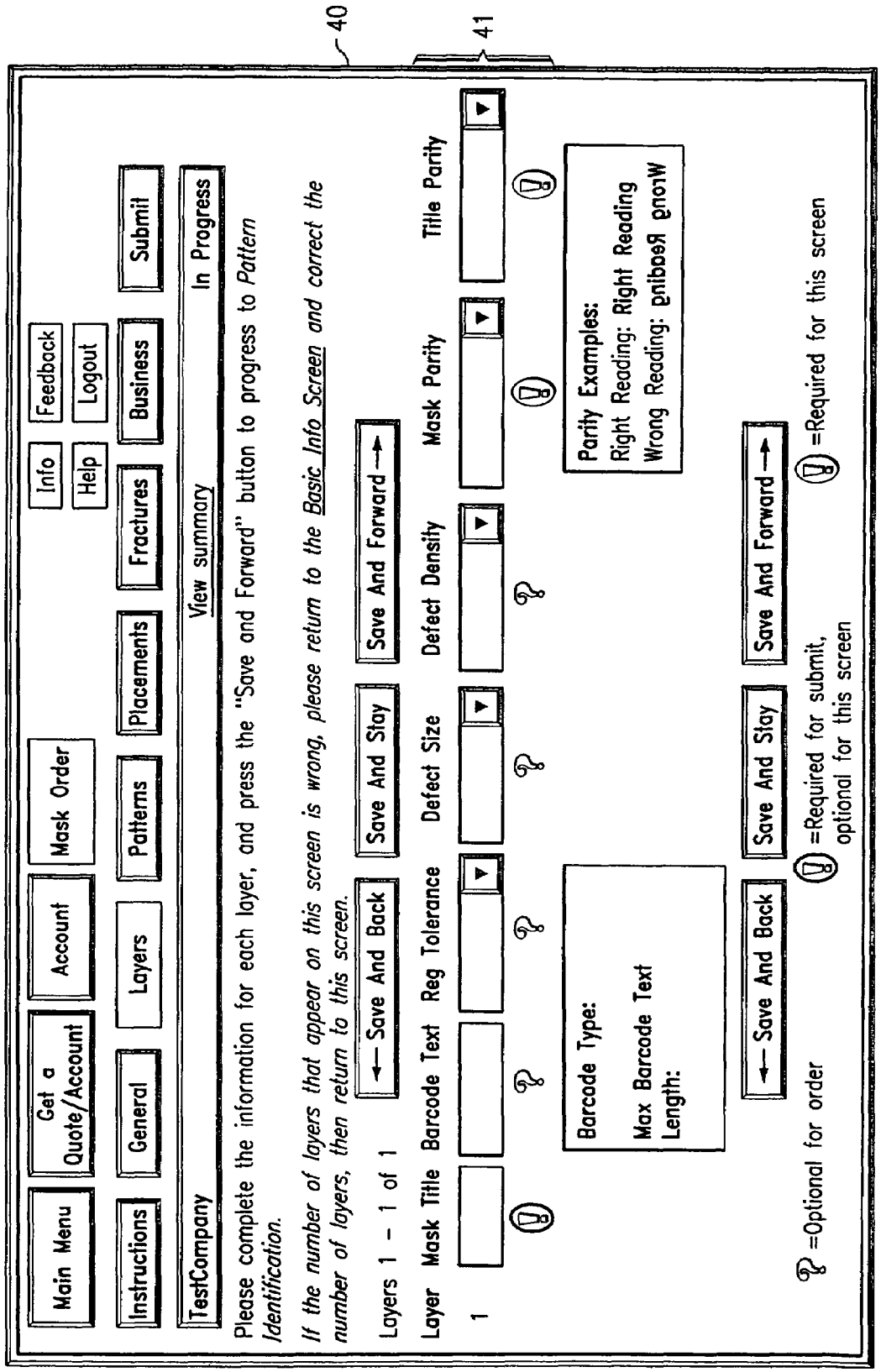

FIG. 4 illustrates a layer data screen 40, which prompts the customer to enter data for each layer. Screen 40 has a layer data line 41 for only one layer. Additional lines 41 would be displayed for additional layers, such that there are as many lines 41 as there are layers specified in box 35 of screen 30. For each layer, the customer is prompted to enter a title, a barcode, a registration tolerance, and other layer information.

FIG. 5 illustrates a pattern data screen 50. A set of pattern data lines 51 is displayed for every pattern specified in screen 30. On a first line of set 51, the customer enters a pattern name, which identifies the pattern as a primary, test, frame, or other type of pattern. The customer also specifies whether the pattern is to be fractured. On subsequent lines of set 51, for each layer, the customer specifies a number of placements, the location of the placements, and other fracturing data. Critical dimension (CD) data permits the manufacturer to verify whether the photomask meets the customer's specifications. Although there is only a single layer in the example of FIG. 5 (and thus two lines in set 51), additional lines would be generated for additional layers.

Figure 6:
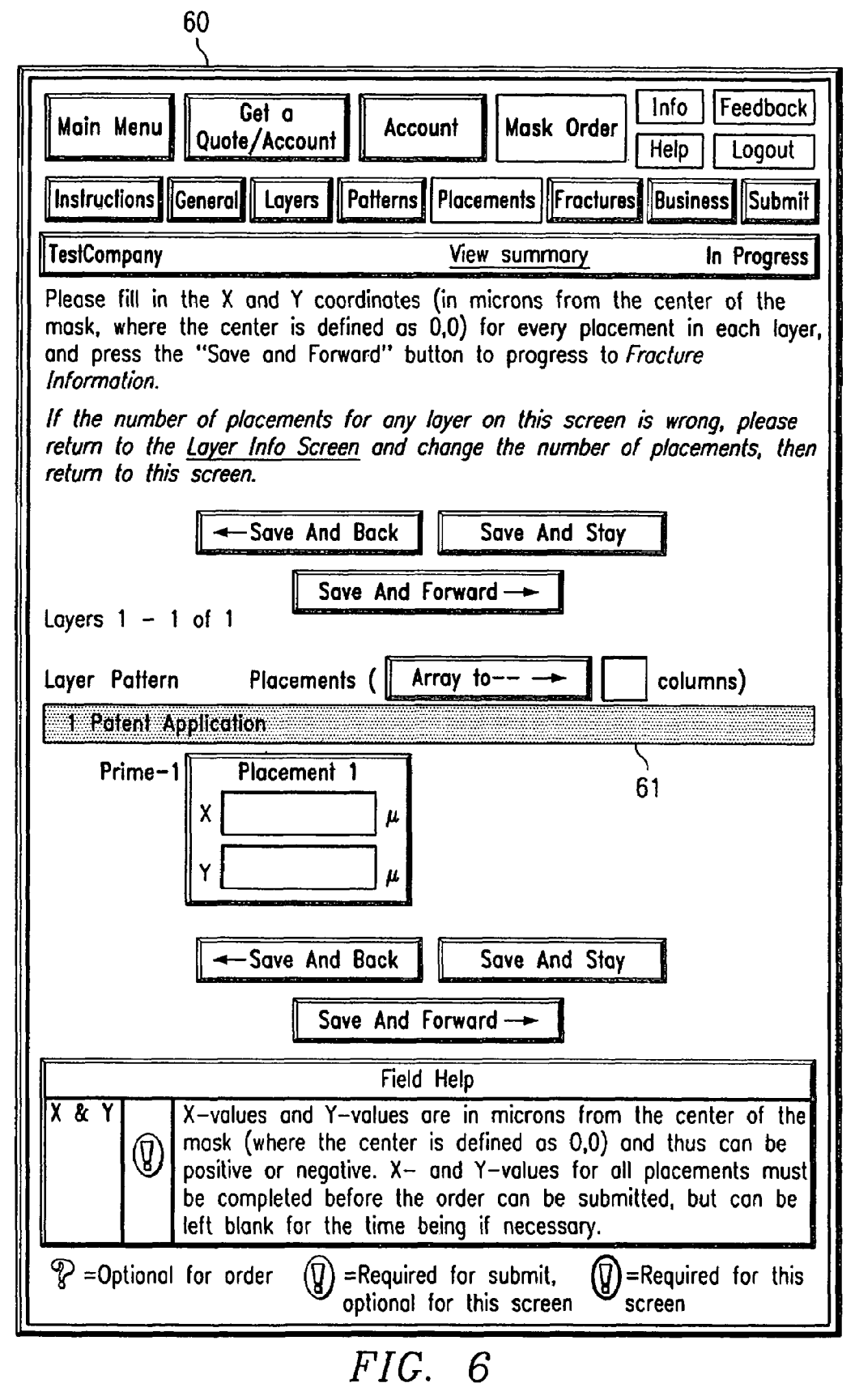

FIG. 6 illustrates a pattern placement screen 60. Using screen 60, the customer specifies where to place each pattern. As indicated in line 61, pattern data is carried forward from screen 50, so that screen 60 progresses through each layer and each pattern on each layer.

FIG. 7 illustrates a pattern fracture screen 70. Again, data from prior screens is carried forward. Although FIG. 7 illustrates data entry for a single pattern, line 71 would be repeated for each pattern, as are the data entry boxes. A database entry line 72 prompts the customer to enter data used to identify and locate pattern data in the customer database 110. Additional boxes 73 on screen 70 prompt the customer to enter scale, GDS, and window limit data.

Processing Additional to Order Entry

Referring again to FIGS. 1A and 1B, various steps additional to customer order entry (Step 121) are illustrated. As explained below, these steps occur simultaneously with, or subsequent to, order entry.

Step 125 occurs after Step 121. The data entered by the customer during the order entry process is stored as photomask specification data in photomask specification database 112.

Step 122 is receiving billing data from the customer. This step may occur during the same network connection as Step 121. In the example of this description, a billing data screen immediately follows screen 70.

FIG. 8 illustrates a billing data screen 80, used to receive billing data for Step 122. The customer is prompted to enter various information for use in billing for the photomask(s).

Step 123 is a validation step, which may be performed during or after Step 121. That is, Step 123 may be performed while the customer is still on-line. In Step 123, interface computer 108 processes the order data to ensure that it is valid. Examples of validation techniques include ensuring that the customer has entered all required data during Step 120. As another example, customer data might be checked to ensure that specified patterns will fit on the layer. A detailed description of the validation is set out below.

FIG. 9 illustrates a validation screen 90. Screen 90 indicates that Step 123 has been performed. If one of the validation tests of Step 123 had failed, the customer would be informed with a different message in screen 90 and given an opportunity to return to the screen whose data caused the lack of validity, so the error could be corrected.

FIGS. 10A and 10B illustrate an order summary screen 100, which is delivered to the plant that is to produce the photomask(s). An order summary may also be sent to the customer computer 102. Screen 100 may be delivered electronically or printed and delivered in hardcopy form.

In Step 124, certain items of the order entry data are selected and arranged for use by a billing system. For example, the order data may be formatted as a "semi file", which complies with a semiconductor industry standard for order information. A special billing data generator 118 may be used for this task. However, as stated above in connection with FIGS. 1A and 1B, the division of processing tasks performed by the computing equipment of local network 100 may vary in different embodiments of the invention.

Step 126 is performed as the customer inputs data (during Step 121). During Step 126, command generator 114 receives the fracturing data entered into screen 70. It uses this data, as well as fracturing algorithms stored in its program memory, to generate fracturing instructions.

For some manufacturing systems, the fracturing instructions for a particular set of patterns are referred to as a "cinc file". The following instructions represent a portion of cinc file, and describe a single pattern.

```
!Fracture_1
clear
Allocate_rects 500000
Allocate_traps 500000
Allocate_space 20000000
Format MEBES
Mebes MACHINE 3
Compact FLY
Rule PARAGON
Border OUTSIDE
Input $INPUT_PATH/JEFF.GDS
Resolution 0
Structure MAIN
Layers 1,3,5,7
Limits (−12000, −15000, 12000, 15000)
Scale 1
Output $OUTPUT_PATH/dpi000000_22.cflt
Do
```

A complete cinc file would have a similar description for each pattern.

The automatic generation of fracturing instructions eliminates the errors associated with manual input. The fracturing instructions may be generated "on-line" as the customer enters pattern and fracture data. As stated above in connection with FIGS. 1A and 1B, the fracturing instructions are used in conjunction with the customer's design data to create photomask patterns recognizable by the manufacturing equipment.

In Step 127, command generator 114 receives the photomask specification data from database 112. It uses this data to generate instructions for the manufacturing equipment. The result is a set of computer instructions that will cause the patterns to be written on the photomask plate. These instructions are sometimes referred to as a "job deck".

In Step 128, the customer's circuit design data is delivered to the manufacturer. If the design data is sent in electronic form, it may be sent over a connection different from that of the network used for order entry. For example, a secure FTP file transfer could be used. The design data is stored in a customer database 110.

Validation of Photomask Specification and Billing Data

As stated above, in Step 123, the customer's photomask specification data may be validated on-line, i.e., as it is being entered.

The following validation process is one example of a set of tasks performed during Step 123. As indicated below, many of the validation tasks can be categorized. Some tasks determine whether specified data has been entered. Other tasks determine whether data is in a specified format, i.e., decimal in range. Other tasks determine whether data meets specified dimensional criteria, such as whether patterns fit on a mask or whether placements line up.

For each of the screens illustrated in FIGS. 3A-9, the following validation tasks occur:

General tooling data screen 30:
  Validated to exist:
    Customer Name
    Device Name
    Number of layers
    Number of patterns
  Validated be integer in range
    Number of layers (1-99)
    Number of patterns (1-99)
  Validated to be decimal in range
    Reflectivity (0.0-100)
  Special validation
    Email address
Layer Data Screen 40:
  Validated to exist
    Layer name
  Special validation
    Layer names are validated to be unique
Pattern Data Screen 50:
  Validated to exist
    Number of pattern placements per layer
  Validated to be integer in range
    Number of pattern placements per layer (0-99)
  Validated to be decimal in range
    Address units out (0.0-10.0)
    Final CD Size (any decimal)
    CD Tolerance (0.0-1000.0)
Pattern Placement Screen 60:
  Validated to be decimal
    Placement X (any decimal)
    Placement Y (any decimal)
Pattern Fracture Screen 70:
  Validated to be decimal in range
    Fracture data scale out (0.0-10000.0)
  Special Validation
    Fracture database name is validated to be valid file name
    Fracture top structure is validated to be valid file name
    Window limits are validated so that the absolute value of upper right X—lower left X is less than or equal to the width of the glass
    Window limits are validated so that the absolute value of upper right Y—lower left Y is less than or equal to the height of the glass
Billing Data Screen 80:
  Special Validation
    Account manager email, billing information email, and shipping information email are all validated to make sure they could be valid email addresses
Validation Screen 90:
  Customer name
  Device
  Contact name
  Contact phone
  Contact fax
  Contact email
  Product type
  Glass Type
  Glass Size/Thickness
  Glass Coating
  Defect Criteria
  Plot Size
  Number of layers
  Number of patterns
    Validate Fields For Screen: Order Business Info
      PO Number
      Billing Address
      Billing City
      Billing State
      Billing Country
      Billing Zip
      Bill Contact
      Bill Contact Phone
      Bill Contact Fax
      Bill Contact Email
      Shipping Address
      Shipping City
      Shipping State
      Shipping Country
      Shipping Zip
      Ship Contact
      Ship Contact Phone
      Ship Contact Fax
      Ship Contact Email
  Get the number of layers
    Walk through layers & validate each one:
      Get the array of layer attributes
      Validate Fields For Screen: Layer Info
      Mask Title
      Barcode text (if required based on previous information)
      Mask Parity
      Title Parity
    Next Layer
    Validate pattern data
    Pattern Name
    Fracture Required
    Decide whether fracture required or not
    Validate Fields For Screen: Fracture Info
      NOTE: these are only the top level fields, not layer dependent
      Database Name
      Top Structure
      Data Scale Out
      Window Limits—LLX
      Window Limits—LLY
      Window Limits—URX
      Window Limits—URY
    Get & validate pattern arrays
    Initialize the total placements
    Validate pattern array data (Pattern & Fracture)
      Validate the pattern info
      Address Units Out
      Final CD Size
      CD Digitized
      Digitized Data Tone
      Validate the fracture info
      GDS Layers
      Input pattern file name
    Get & validate number of placements Validate placement data
   Get the placement attributes
   Form the root for the error message
   Validate Fields For Screen: Placement Info
      X Value
      Y Value
   Next Placement
   End If numPatternLayerPlacements>0
   Next Pattern layer
   Next Pattern Other Embodiments Although the present invention has been described in detail, it should be understood that various changes, substitutions, and alterations can be made hereto without departing from the spirit and scope of the invention as defined by the appended claims.

What is claimed is:

1. A system for generating photomask orders in a specified format comprising:
    at least one form for entry of photomask order data;
    at least one set of validation rules corresponding to the at least one form, the at least one set of validation rules including instructions operable to ensure that a user enters sufficient information into the at least one form in accordance with at least one of a specified photomask format and a specified dimensional criterion; and
    a graphical user interface associated with the at least one form, the graphical user interface operable to allow the user to access the at least one form to enter the photomask order data.

2. The system of claim 1, wherein the instructions operable to ensure that a user enters sufficient information are further operable to ensure that the user enters complete information into the at least one form as required by the specified photomask format.

3. The system of claim 1, wherein the instructions operable to ensure that a user enters sufficient information are further operable to ensure that the user enters accurate information into the at least one form as required by the specified photomask format.

4. The system of claim 1, wherein the at least one form is further operable to store the photomask order data.

5. The system of claim 1, wherein at least one of the at least one form and the at least one set of validation rules permits entry of the photomask order data in accordance with requirements of at least one of a particular standard photomask format and a particular proprietary photomask format.

6. The system of claim 5, wherein the at least one form comprises interface features operable to permit entry of the photomask order data in accordance with the requirements of at least one of a particular standard photomask format and a particular proprietary photomask format.

7. The system of claim 1, wherein the at least one set of validation rules are stored separately from the at least one form.

8. The system of claim 1, wherein the at least one set of validation rules has at least one subset of validation rules, each of the at least one of validation rules including further instructions operable to ensure that the user enters sufficient information into the at least one form in accordance with at least one of a specified photomask format and a specified dimensional criterion.

9. The system of claim 1, wherein the at least one form and the graphical user interface can be accessed by the user on a standalone computer independent of a computer operable to execute the instructions operable to ensure that the user enters sufficient information.

10. A system for generating photomask orders in a specified format comprising:
    at least one form for entry of photomask order data;
    at least one set of validation rules corresponding to the at least one form, the at least one set of validation rules operable to validate the entry of the photomask order data into the at least one form; and
    a graphical user interface associated with the at least one form, the graphical user interface operable to allow a user to access the at least one form to enter the photomask order data.

11. The system of claim 10, wherein the at least one set of validation rules includes instructions to ensure that the user enters complete information into the at least one form in accordance with at least one of a specified photomask format and a specified dimensional criterion.

12. The system of claim 10, wherein the at least one set of validation rules includes instructions to ensure that the user enters accurate information into the at least one form in accordance with at least one of a specified photomask format and a specified dimensional criterion.

13. The system of claim 10, wherein the at least one form is further operable to store the photomask order data.

14. The system of claim 10, wherein at least one of the at least one form and the at least one set of validation rules permits the entry of the photomask order data in accordance with requirements of at least one of a particular standard photomask format and a particular proprietary photomask format.

15. The system of claim 14, wherein at the least one form comprises interface feature operable to permit the entry of the photomask order data in accordance with the requirements of at least one of a particular standard photomask format and a particular proprietary photomask format.

16. The system of claim 10, wherein the at least one set of validation rules are stored separately from the at least one form.

17. The system of claim 10, wherein the at least one set of validation rules has at least one subset of validation rules, each subset of validation rules including further instructions operable to ensure that the user enters sufficient information into the at least one form in accordance with at least one of a specified photomask format and a specified dimensional criterion.

18. A system for generating photomask orders in a specified format comprising:
    at least one form for the entry of photomask order data, wherein at least some of the photomask order data is imported from a preexisting order and automatically entered into the at least one form prior entry of data into the form by a user;
    at least one set of validation rules corresponding to the at least one form, the validation rules operable to validate the entry of photomask order data into the at least one form; and
    a graphical user interface associated with the at least one form, the graphical user interface operable to allow the user to access the at least one form to enter photomask order data.

19. The system of claim 18, wherein the at least one set of rules includes instructions to ensure that the user enters complete information into the at least one form in accordance with at least one of a specified photomask format and a specified dimensional criterion.

20. The system of claim 18, wherein the at least one set of rules includes instructions to ensure that the user enters accurate information into the at least one form in accordance with at least one of a specified photomask format and a specified dimensional criterion.

21. The system of claim 18, wherein the at least one form is further operable to store photomask order data.

22. The system of claim 18, wherein at least one of the at least one form and the at least one set of validation rules permits entry of photomask order data in accordance with the requirements of at least one of a particular standard photomask format and a particular proprietary photomask format.

23. The system of claim 22, wherein the at least one form comprises interface features operable to permit entry of photomask order data in accordance with the requirements of at least one of a particular standard photomask format and a particular proprietary photomask format.

24. The system of claim 18, wherein the at least one set of validation rules has at least one subset of validation rules, each subset of validation rules including further instructions operable to ensure that a user enters sufficient information into the at least one form in accordance with at least one of a specified photomask format and a specified dimensional criterion.

\* \* \* \* \*